US011371910B2

(12) United States Patent
Nkwitchoua Djangang et al.

(10) Patent No.: US 11,371,910 B2
(45) Date of Patent: Jun. 28, 2022

(54) DEVICE FOR DETERMINING THE STATE OF A MECHANICAL COMPONENT, USE OF A MEASURING APPLIANCE, SYSTEM, AND METHOD FOR DETERMINING THE STATE OF A MECHANICAL COMPONENT

(71) Applicant: VDEH-BETRIEBSFORSCHUNG-SINSTITUT GMBH, Dusseldorf (DE)

(72) Inventors: Achille Fabien Nkwitchoua Djangang, Neuss (DE); Jan Polzer, Duisburg (DE)

(73) Assignee: VDEh-Betriebsforschungsinstitut GmbH, Düsseldorf (DE)

( * ) Notice: Subject to any disclaimer, the term of this patent is extended or adjusted under 35 U.S.C. 154(b) by 0 days.

(21) Appl. No.: 16/632,798

(22) PCT Filed: Jul. 18, 2018

(86) PCT No.: PCT/EP2018/069562
§ 371 (c)(1),
(2) Date: Jan. 21, 2020

(87) PCT Pub. No.: WO2019/020473
PCT Pub. Date: Jan. 31, 2019

(65) Prior Publication Data
US 2021/0131912 A1 May 6, 2021

(30) Foreign Application Priority Data
Jul. 24, 2017 (DE) .......................... 102017212666.3

(51) Int. Cl.
*G01M 13/04* (2019.01)
*G05B 23/02* (2006.01)
*G01R 19/00* (2006.01)

(52) U.S. Cl.
CPC ......... *G01M 13/04* (2013.01); *G01R 19/0084* (2013.01); *G05B 23/0281* (2013.01)

(58) Field of Classification Search
CPC ............... G01M 13/04; G01R 19/0084; G01R 19/0092
See application file for complete search history.

(56) References Cited

U.S. PATENT DOCUMENTS 4,632,223 A    12/1986   Maurer et al.
5,477,334 A * 12/1995   Keswani .................. G01J 3/46
                                                                                        356/405

(Continued)

FOREIGN PATENT DOCUMENTS

CN   102099701 A   6/2011
CN   102770744 A   11/2012

(Continued)

OTHER PUBLICATIONS

Bethke, Jurgen, "Schmierfilmdicke beruhrungslos messen", F & M, Feinwerktechnik, Mikrotechnik, Messtechnik, vol. 100, No. 12, pp. 549-553 Betrifft Merkmale 1.0-2.2, 5.0-6.2, 8.0-8.4, 1992.

(Continued)

*Primary Examiner* — Noam Reisner
(74) *Attorney, Agent, or Firm* — Howard IP Law Group, P.C.

(57) ABSTRACT

A device for determining the state of a mechanical component, in which, when the component is in use, at least part of the component moves in relation to another component, particularly of drives or bearings or transmissions, using a measuring device that can determine an electrical variable or the change in an electrical variable.

8 Claims, 7 Drawing Sheets

(56) References Cited

U.S. PATENT DOCUMENTS

Figure 2A:
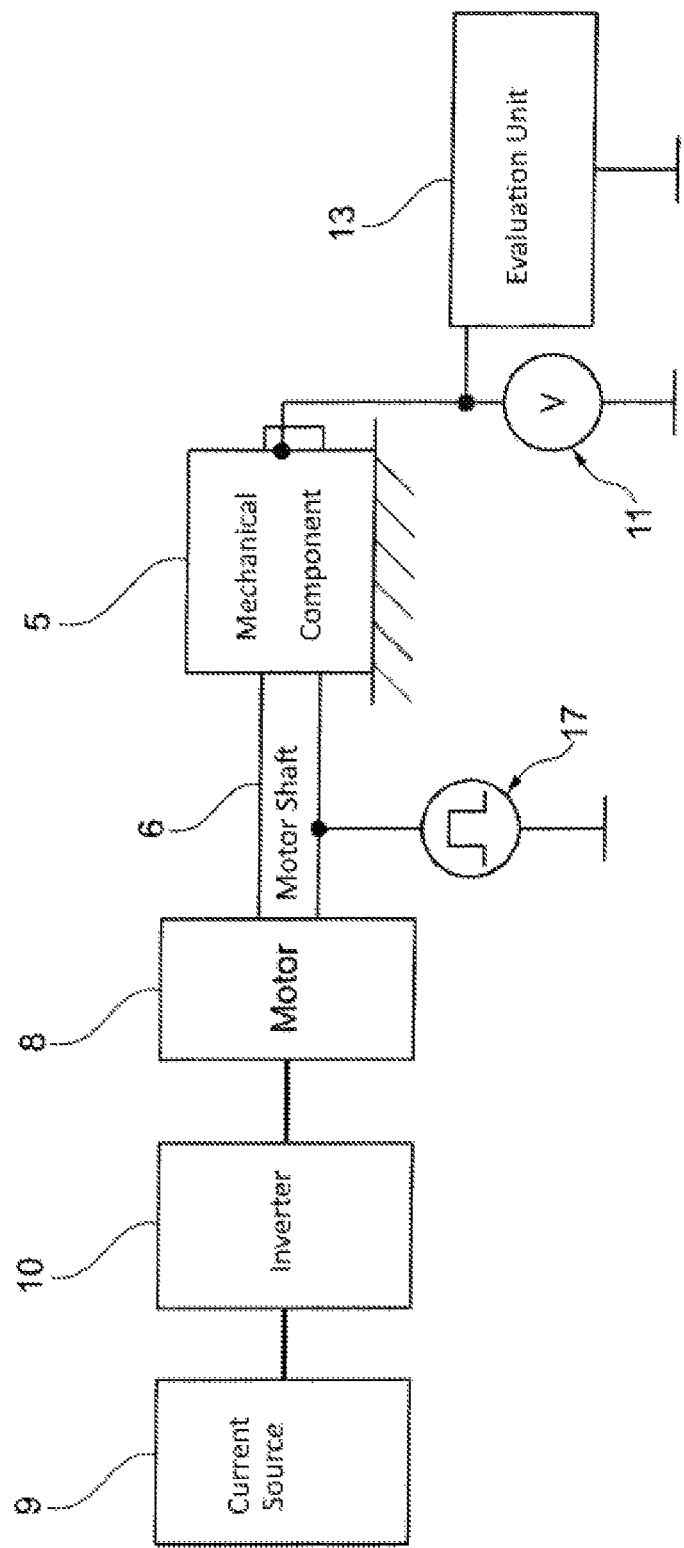

| | | |
|---|---|---|
| 5,936,410 A | 8/1999 | Dunfield et al. |
| 9,133,827 B2 | 9/2015 | Bauer et al. |
| 2011/0169504 A1 | 7/2011 | Pekola et al. |
| 2012/0319636 A1 | 12/2012 | Gattermann et al. |
| 2012/0323372 A1 | 12/2012 | Gattermann et al. |
| 2012/0330580 A1 | 12/2012 | Frueh et al. |
| 2015/0176638 A1 | 6/2015 | Hebrard |
| 2015/0355075 A1 | 12/2015 | Murray et al. |
| 2016/0327452 A1* | 11/2016 | Vilar .................. G01M 13/04 |

FOREIGN PATENT DOCUMENTS

| | | |
|---|---|---|
| CN | 102770776 A | 11/2012 |
| CN | 102792139 A | 11/2012 |
| DE | 825178 B | 12/1951 |
| DE | 3338420 A1 | 5/1985 |
| DE | 102004056996 A1 | 6/2006 |
| JP | S54074551 U | 5/1979 |
| JP | S63105068 U | 7/1988 |
| JP | 2002031132 A | 1/2002 |
| JP | 2007292731 A | 11/2007 |
| JP | 2007298527 A | 11/2007 |
| JP | 2008185339 A | 8/2008 |
| JP | 2012021948 A | 2/2012 |
| JP | 2014228378 A | 12/2014 |
| JP | 2016024090 A | 2/2016 |
| JP | 2017032567 A | 2/2017 |
| WO | 2005093226 A1 | 10/2005 |
| WO | 2006134068 A1 | 12/2006 |
| WO | 2008000285 A1 | 1/2008 |
| WO | 2015043619 A1 | 4/2015 |
| WO | WO-2015043619 A1 * | 4/2015 ........... G01R 31/343 |

OTHER PUBLICATIONS

Bethke, Jurgen, "Entwicklung einer praktisch einsetzbaren Mebtechnik fur die Schmierfilmdicke in Walzlagern und anderen realen tribologischen Systemen", Fortschritt-Berichte VDI1992, Reihi 1 Nr. 203, Dusseldorf: VDI-Verlag, 1992.

"Elektrische Kapazitat"—Versionsunterschied; htttps://de.wikipedia.org/w/index.php?title=ElektrischeKapazit&oldId=163494355; Mar. 11, 2017. A machine translation of this document into English is attached.

English translation of International Search Report dated Oct. 26, 2018 for equivalent application PCT/EP2018/069562.

Office Action received for JP Patent Application No. 2020-503279, dated Feb. 28, 2022, 4 pages (English Machine Translation).

* cited by examiner

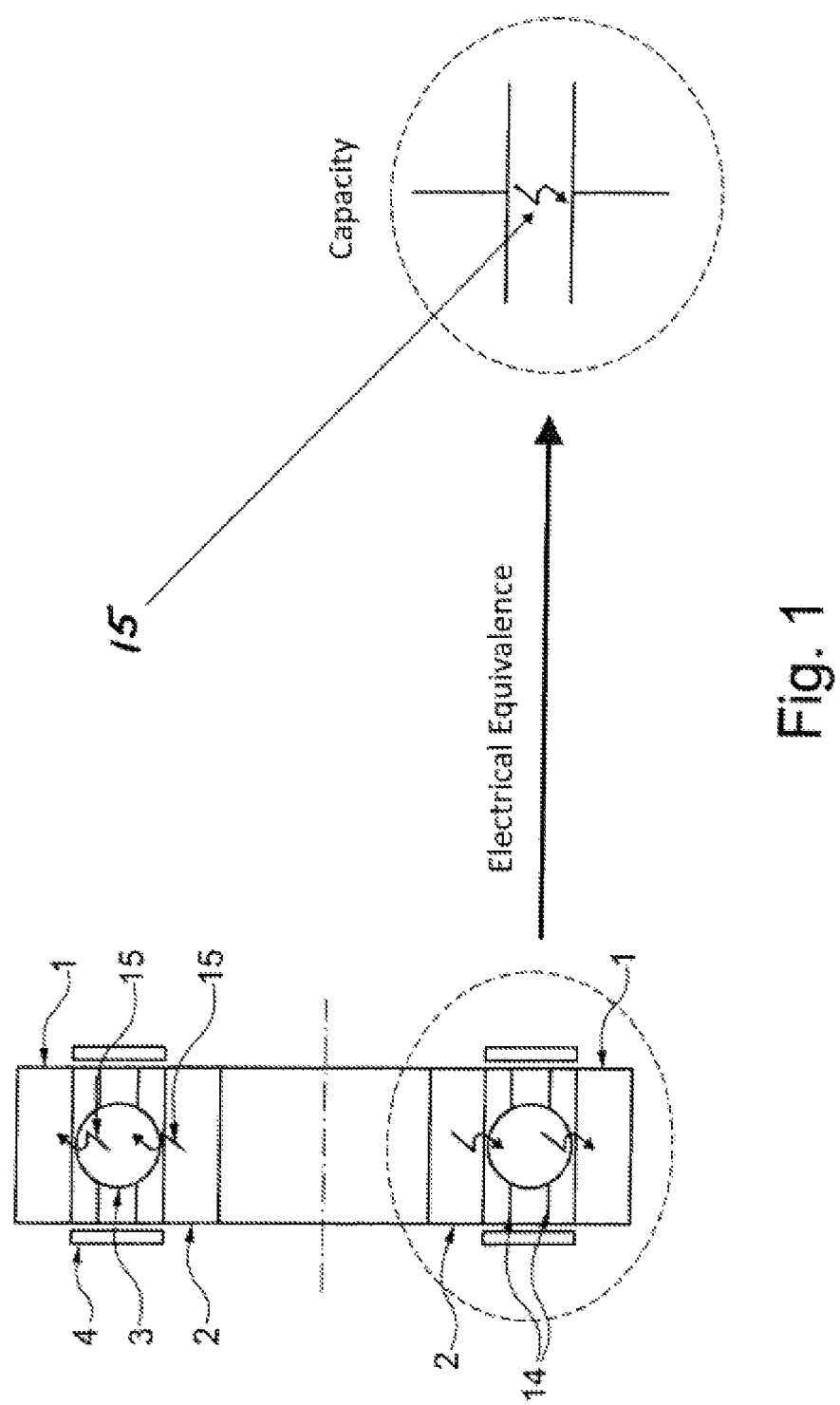

DEVICE FOR DETERMINING THE STATE OF A MECHANICAL COMPONENT, USE OF A MEASURING APPLIANCE, SYSTEM, AND METHOD FOR DETERMINING THE STATE OF A MECHANICAL COMPONENT

CROSS-REFERENCE TO RELATED APPLICATIONS

This application is the national stage application under 35 U.S.C. § 371 of International Application No. PCT/EP2018/069562 filed on Jul. 18, 2018, and claims the benefit of DE 10 2017 212 666.3 filed on Jul. 24, 2017, the entire disclosures of which are incorporated herein by reference in their entireties.

The invention relates to a device for determining the state of a mechanical component, in which, when the component is in use, at least part of the component moves in relation to another component, as well as the use of a measuring device, can determine an electrical variable or the change in an electrical variable. Moreover, the invention relates to a system and a method for determining the state of a mechanical component.

Both during the manufacture of mechanical components for which at least part of the component moves in relation to another component during the use of the component, such as drives or bearings in particular, and during the operation of mechanical components, information as to the state of the mechanical component is of interest. In particular, during the manufacture of a mechanical component it is of interest to ascertain whether the mechanical component complies with the quality standards established for its design and construction and in particular whether it contains all the components provided in the design, whether these components have the desired form, whether these components are present in the desired quality (for example, free of cracks and blowholes) and whether parts of the mechanical component obey the spacings of individual components from each other as set forth in their design and construction, especially the tolerances set forth. Moreover, it is of interest in the manufacture of new mechanical components whether the mechanical component has the lubrication set forth in its design and construction, especially also regarding the location where the lubrication should be present, and regarding the quality of the lubricant used, as well as the amount of lubricant to be provided.

During the operation of a mechanical component for which at least part of the component moves in relation to another component during the use of the component, it is of interest in particular to ascertain whether the mechanical component continues to conform to the quality standards set forth in its design and construction and whether the aging process assumed in its design and construction occurs to the planned extent, and especially whether all the components provided in the design continue to be present, whether these components still have the desired form or that corresponding to the anticipated aging process, whether these components are present in the desired quality (for example, free of cracks and blowholes) and whether parts of the mechanical component obey the spacings of individual components from each other as set forth in their design and construction, especially the tolerances set forth. Moreover, it is of interest in the operation of mechanical components whether the mechanical component has the lubrication set forth in its design and construction, especially also regarding the location where the lubrication should be present, and regarding the quality of the lubricant used, as well as the amount of lubricant to be provided.

In the prior art it is known how to ascertain the state of a mechanical component for which at least part of the component moves in relation to another component during the use of the component by using mechanical measurement methods. Thus, measurements and distances from one another are often investigated by means of corresponding measurement methods, primarily using sliding calipers. As regards the lubrication, it is often provided to take samples and to test these samples in regard to the quality of the lubricant, especially also in regard to a possible aging. Moreover, it is known how to use maintenance schedules in the operation of mechanical components, which are often based on hours of operation or kilometers driven (for a motor vehicle), for example.

Against this background, the problem which the invention proposes to solve is to propose a device as well as a system and a method for determining the state of a mechanical component in which, when the component is in use, at least part of the component moves in relation to another component, which can be carried out especially easily.

The invention starts from the basic notion of ascertaining the state of a mechanical component in which, when the component is in use, at least part of the component moves in relation to another component, not by using mechanical measurement methods, but rather by the determination of an electrical variable or by the determination of a change in an electrical variable. Namely, the invention has discovered that an electrical variable which is determined at the mechanical component can provide information about the state of the mechanical component. The many electrical variables can be measured in easy manner, so that a simple type of determination of the state of a mechanical component is provided with the basic notion according to the invention.

According to the invention it has been discovered that the absolute value of an electrical variable can already provide information about the state of the mechanical component, such as a measured resistance value in ohms or a measured capacitance in farads. Yet it has also been discovered according to the invention that the observation of the change in an electrical variable over a segment of time also allows a statement as to the state of a mechanical component, for example the change in the resistance measured in ohms over a period of observation or the change in the capacitance measured in farads over a period of observation.

Likewise, the observing of the rate of change can furnish information about the state of the mechanical component, i.e., the discovery that for example the impedance changes with a first rate in a first period of observation and with a second rate in a second period of observation.

Likewise, the observation can be done through a voltage or current signal introduced at the component, since the measurable electrical signal transmission behavior is dependent on the state of the movable component. It is also possible in addition or alternatively to consider a stray voltage or current signal, so that no voltage or current signal has to be introduced from the outside. It is not necessary to provide a special sensor. The signal can be picked off at the component.

With the proposed method, one can carry out a detailed testing of the properties of the installed, new bearing, transmission, or drive, and thus also monitor the dimensional stability of the overall system.

In particular, it is possible with the invention to ascertain, as the state of the mechanical component for which at least part of the component moves in relation to another component during use of the component, whether the component is lubricated and how much lubrication it has (especially a change in the thickness of the lubricating film) and the quality of the lubricant (especially the state of the aging process). For example, the invention affords an early assessment of the lubricant quality in a bearing or in a drive train. This is important, as very many bearing defects occur on account of inadequate lubrication. The invention also allows an analysis of very slow rotating bearings, which can hardly be analyzed with a vibration analysis, for example. The invention allows an early identification of the state of the bearing or the transmission or the drive train, and mechanical damage thereof. With the invention, it is possible to establish as the state of the movable mechanical component whether mechanical damage is present at or in the component, i.e., deviations from the shape of parts of the component as set forth in the design and construction of the mechanical component. Likewise, the dimensional stability of parts of the mechanical component can be checked.

Likewise, deviations in material quality can be detected, namely, such as have an influence on the electrical conductivity.

Especially suitable as the electrical variable to be determined, or the electrical variable whose change is determined according to the invention, is the change in the electrical voltage and/or the electrical current applied to or flowing at the component. For example, it is possible to measure the current and/or the voltage in a bearing at the inner and/or outer race or at the rotor and/or stator. It is possible to use an inserted or already present (e.g., a stray) voltage or current signal, since the measurable electrical signal transmission behavior is dependent on the state of the movable component. The electrical variable being determined can also be the electrical impedance between a first part of the mechanical component and a second part of the component, at a distance from the first part.

The device according to the invention for determining the state of a mechanical component, particularly of drives or bearings, comprises a measuring device that can determine an electrical variable or the change in an electrical variable, in particular, the measuring device can be designed as a voltmeter.

Helpful for this are signal generators, very fast signal detection cards (in the Mega-sample range) and sensitive sensors for current and voltage detection. The evaluation of the measurement signals is usually done with a microprocessor.

In one preferred embodiment, the device according to the invention comprises an evaluation unit, which puts out status information as to the state of the mechanical component on the basis of a measurement result generated by the measuring device wherein at least part of the component moves in relation to another component during use. In particular, a signal line preferably exists between the measuring device and the evaluation unit, along which especially preferably an electrical or optical signal can be exchanged between the measuring device and the evaluation unit. Especially preferably, a variable of the signal, such as its strength or its time variation, is dependent on a characteristic variable of the electrical variable determined by the measuring device or the change in the electrical variable. The output of the status information can be greatly simplified; for example, it may be provided that the evaluation unit upon reaching a particular undesirable state puts out status information in the form of an optical stimulus (for example, a red light comes on) or a tone, while the absence of the optical stimulus or tone indicates that the state of the mechanical component, wherein at least part of the component moves in relation to another component during use, has not yet reached the undesirable state. It is also conceivable to put out the status information gradually, such as in the manner of a traffic light system. It is also conceivable to make specific statements by means of the invention as to the state of the mechanical component, wherein at least part of the component moves in relation to another component during use, for example how many additional hours of operation of the mechanical component are expected before breakdown, wherein at least part of the component moves in relation to another component during use of the component.

In one preferred embodiment, a table is stored in the evaluation unit, in which respective status information about the state of the mechanical component is coordinated with a respective measurement result of the measuring device. In this embodiment, the evaluation unit thus works with a "look up" table. Empirical values can be entered in this table, which can be determined by means of simple test stand investigations.

In one preferred embodiment, the device according to the invention comprises a current source, with which a current can be introduced into the mechanical component, and/or a voltage source, with which a voltage can be applied across a mechanical component. In order to determine particular variables or to determine particular changes in electrical variables it is necessary to introduce a current into the mechanical component or to apply a voltage across the mechanical component. According to one preferred embodiment, the device is outfitted with a current source or a voltage source, so that it is self-contained. It can independently ascertain the state of the mechanical component without the additional presence of a current source or the additional presence of a voltage source.

The device according to the invention can be designed in particular such that an input signal is introduced at one or more contact points of the mechanical component into the mechanical component.

The device according to the invention is designed in particular such that it can pick off at least one electrical output signal at one or more contact points on the mechanical component. This can be done, for example, by a slip ring on the shaft and a cable which is secured to the housing. Both signal lines can then be led to a fast measured value acquisition card. The signal evaluation can be done by a microprocessor.

According to the invention, it is proposed to use a measuring device which can determine an electrical variable or the change in an electrical variable in order to determine the state of a mechanical component, particularly of drives or bearings.

In particular, the electrical variable can be the current strength and/or voltage.

In one preferred embodiment, the measuring device is designed such that it can measure a voltage applied across the mechanical component over a predetermined measurement period. It is especially preferably provided in this embodiment that an evaluation unit is provided, having a module for evaluating the curve of the measured voltage during the measurement period with a multivariate statistical method, wherein the evaluation unit puts out status information as to the state of the movable mechanical component from the evaluation.

The observed mechanical component is especially preferably a drive or a bearing or a transmission. For example, the invention may also find applications in the determining of the state of drives in rolling mills, for bearings in wind turbines, bearing of generators, turbine bearings in aircraft, costly bearings in industrial plants, the monitoring of lubricant quality in the bearing or in the transmission. With the invention, one can carry out a detailed testing of the properties of installed new bearings, transmissions or drives and thereby also monitor the dimensional stability of the overall system. The state of a piston ring in an internal combustion engine can also be inspected in this way (temporarily connect a cable to the crankshaft and to the cylinder block and measure the state in the workshop).

The system according to the invention comprises a mechanical component, wherein at least part of the component moves in relation to another component when the component is in use, and a device according to the invention. The system according to the invention on the one hand describes the state when the device according to the invention is connected to the mechanical component, for example for an individual measurement of the state of the mechanical component, in such a way that the measuring device of the device according to the invention can determine an electrical variable or the change in an electrical variable at the mechanical component. This does not preclude the system according to the invention allowing a separation of the device according to the invention from the mechanical component and thus the system according to the invention exists only temporarily (during the measurement). At the same time, the system claim according to the invention encompasses integrated units composed of the mechanical component and the device according to the invention. Thus, for example, the invention may be readily used for onboard diagnostic systems, such as those in vehicles, especially in railway vehicles or road vehicles, especially motor vehicles, or at production facilities, such as rolling mills.

In one preferred embodiment, the system according to the invention comprises an electric motor, which generates a bearing current that flows through at least portions of the mechanical component. It has been discovered that electric motors often generate bearing currents and that these bearing currents can be used to determine the state of a mechanical component when these bearing currents flow through portions of the mechanical component. Hence, in such an embodiment there is no need to provide a current source or voltage source on the part of the device, since the current or the voltage in such an embodiment can be provided by the bearing current of the electric motor. However, this does not rule out also outfitting the device with a current source and/or a voltage source in such an embodiment.

The method according to the invention calls for using a measuring device to determine an electrical variable or the change in an electrical variable at the mechanical component.

In one preferred embodiment, a voltage source is used to apply a voltage across the mechanical component and a measuring device is used to measure the voltage applied across the mechanical component during a predetermined measurement period. In this embodiment, an evaluation unit is used to evaluate the curve of the measured voltage during the measurement period using a multivariate statistical method, and the evaluation unit puts out status information as to the state of the movable mechanical component from the evaluation. This embodiment is based on the knowledge that status information as to the state of the movable mechanical component can be gained not only from the magnitude of a voltage measured at a particular moment of time, but also status information as to the state of the movable mechanical component can be gained for example from an evaluation of the voltage curve with a multivariate statistical method over a predetermined measurement period.

In one preferred embodiment, the statistical evaluation involves a determination of the frequency distribution of individual voltages over the predetermined measurement period. For example, a histogram can be created as the result of the statistical evaluation, showing which voltage was present within the predetermined measurement period and how often. For simplicity and reasons of clarity, the histogram can combine the voltages in the bars represented in it to form voltage ranges; the bars of the histogram then indicate how often a voltage from this voltage range was present.

In one preferred embodiment, the evaluation unit compares the result of the evaluation using a multivariate statistical method of the voltage curve over a predetermined measurement period and the result of the evaluation using a multivariate statistical method of the voltage curve over a measurement period of equal length, but earlier. This embodiment is based on the knowledge that the voltage curve changes over a measurement period of predetermined length in dependence on the state of the component. Therefore, it becomes possible to ascertain a change in the state of the component by comparing the result of the evaluation using a multivariate statistical method of the voltage curve over a first measurement period and the result of the evaluation using a multivariate statistical method of the voltage curve over a second measurement period of equal length to the first measurement period.

The multivariate statistical method is in particular a statistical method.

In one preferred embodiment, during the performing of the method according to the invention a portion of the mechanical component being investigated moves in relation to another portion of the mechanical component being investigated. However, it is also conceivable for the method according to the invention to be carried out successfully on a stationary component.

In one preferred embodiment, the input signal is constant. However, embodiments are also conceivable in which the input signal is variable in time, having in particular a sine shape or a pulse shape. In one preferred embodiment, the input signal is a pulse, especially a delta pulse, for the determination of the electrical properties of the component. The input signal may be pulselike voltage functions, such as a square pulse, a triangular pulse, or a sawtooth pulse. Good results can be achieved with a pulselike voltage function with at least one steep signal edge, preferably with one steep input edge and one steep output edge. The fundamental frequency of the signal may also be used to achieve good results. Depending on the movement status of the component being investigated, these two parameters make it possible to obtain useful information from their deviations from the reference signal and to thereby determine the state of the mechanical component.

In one preferred embodiment, the change in the impedance is determined, especially a resulting phase shift and/or an amplitude attenuation and/or a change in capacitance of the component.

In one preferred embodiment, the electrical property of the component is determined by feedback at the contact points of the input signals. Thus, at least one contact point for the input signal can be equal to a contact point for an output signal.

In one preferred embodiment, the determination of the mechanical properties of the component is done from a determination of an electrical variable by way of performing a reference measurement, after which the actual measurement is then taken.

In the following, the invention is explained more closely with the aid of drawings showing merely embodiments.

Figure 2B:
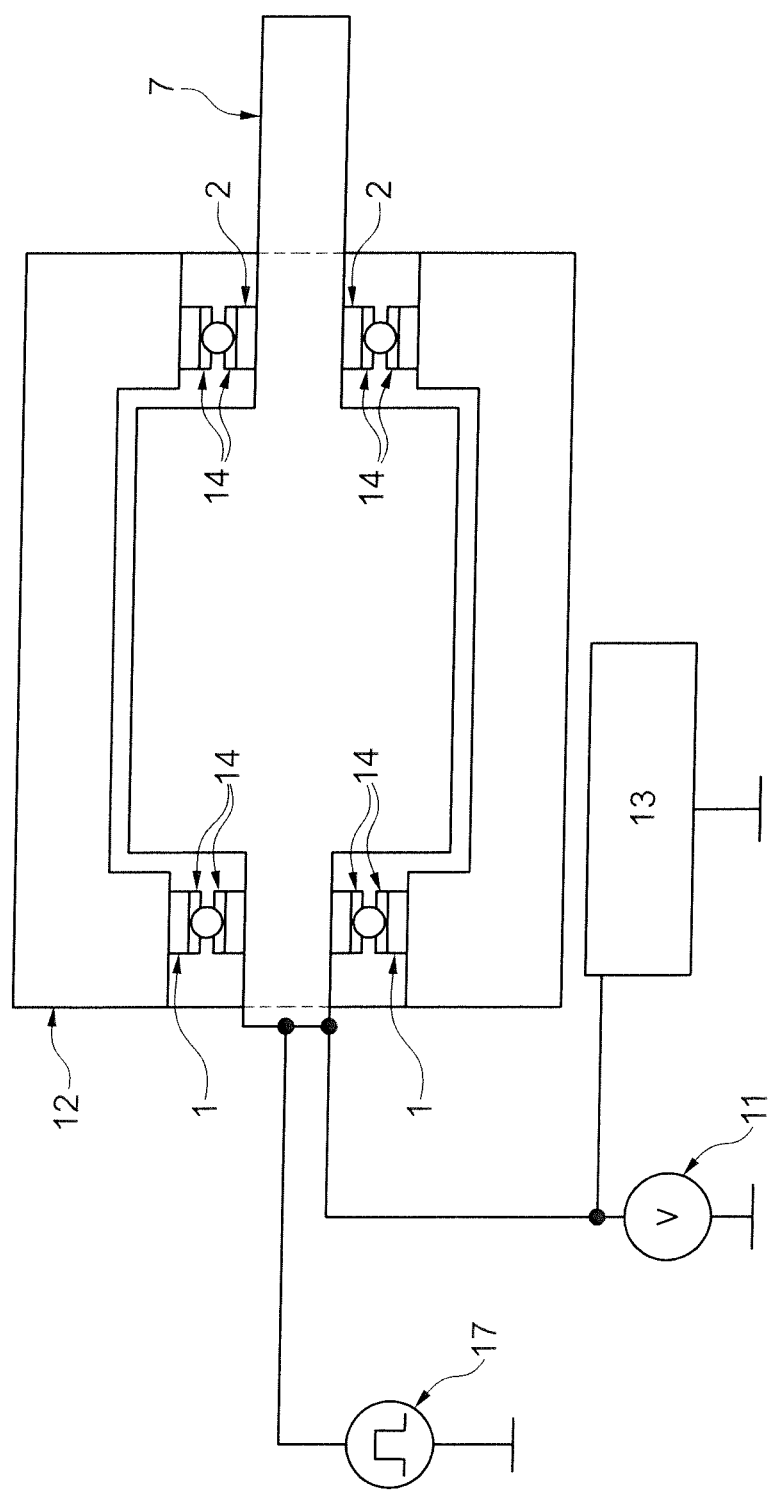
Figure 3:
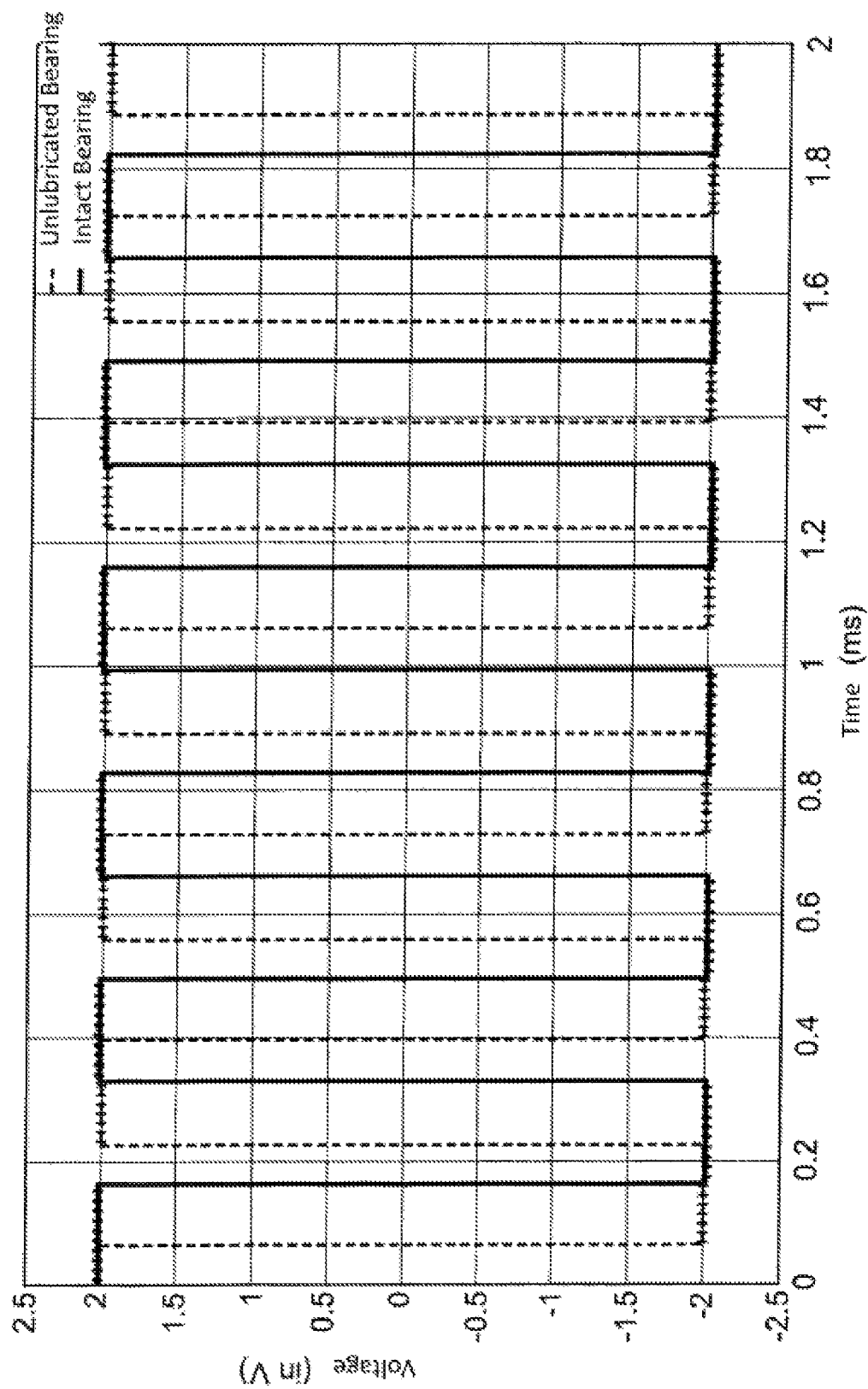
Figure 4:
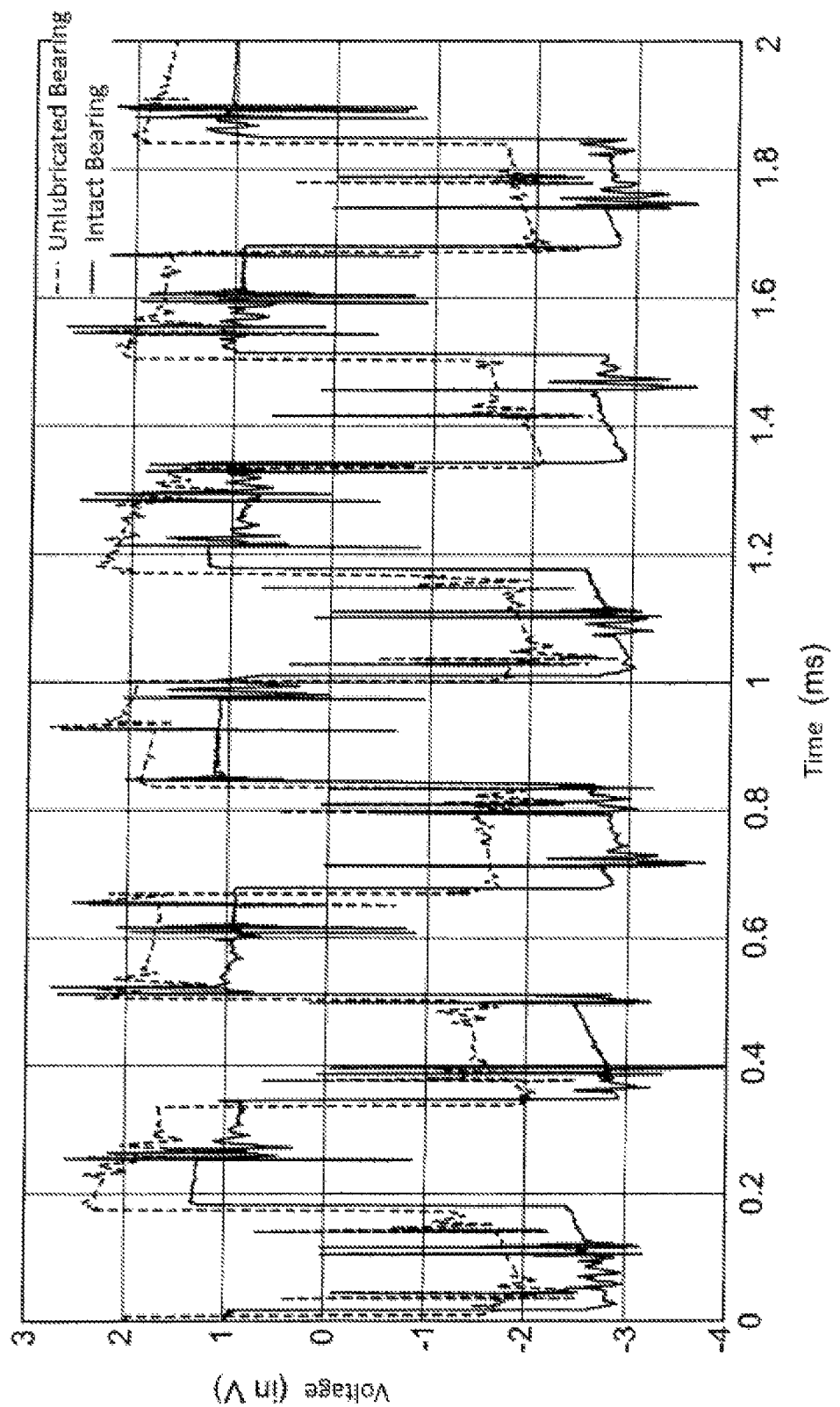
Figure 5:
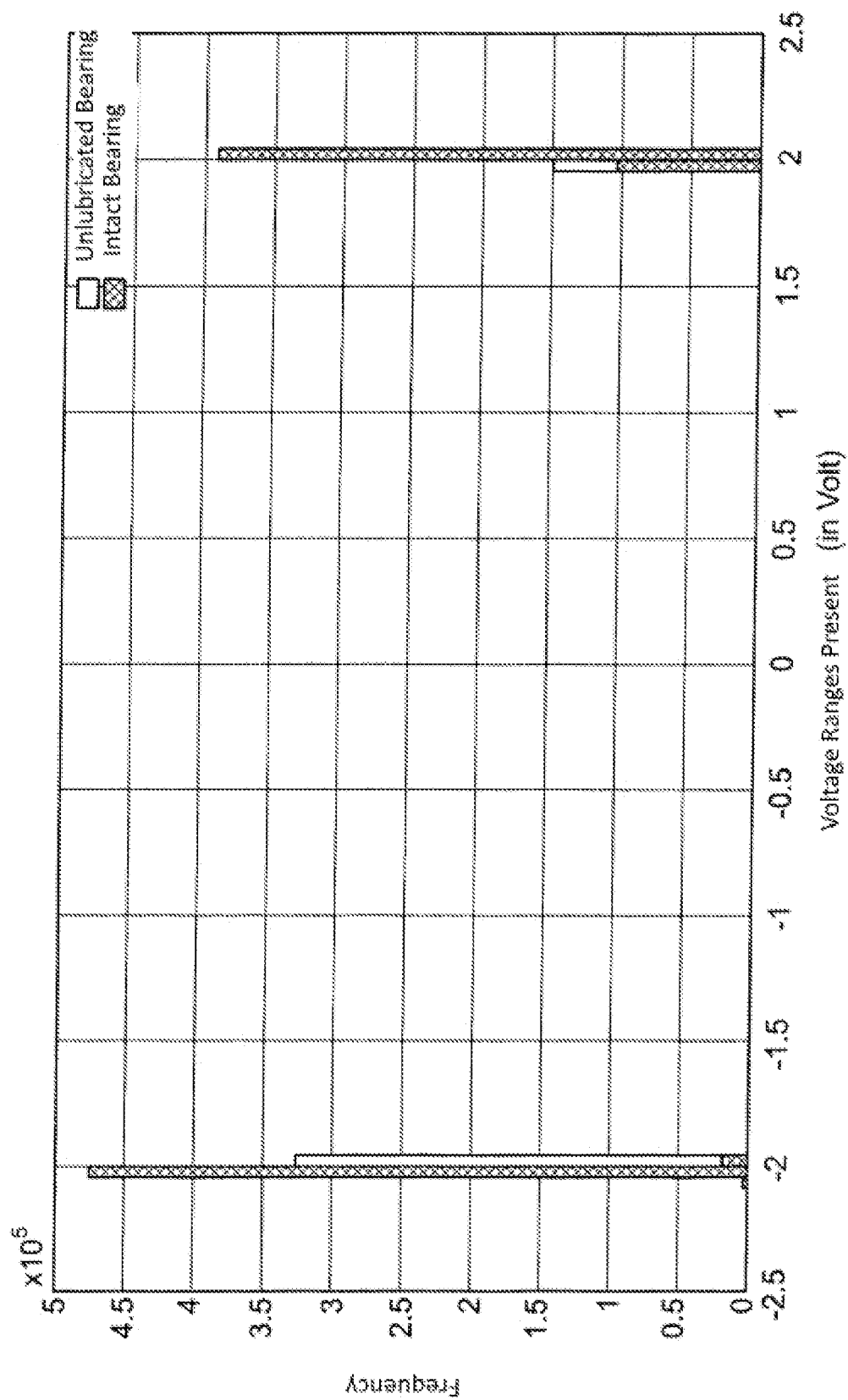
Figure 6:
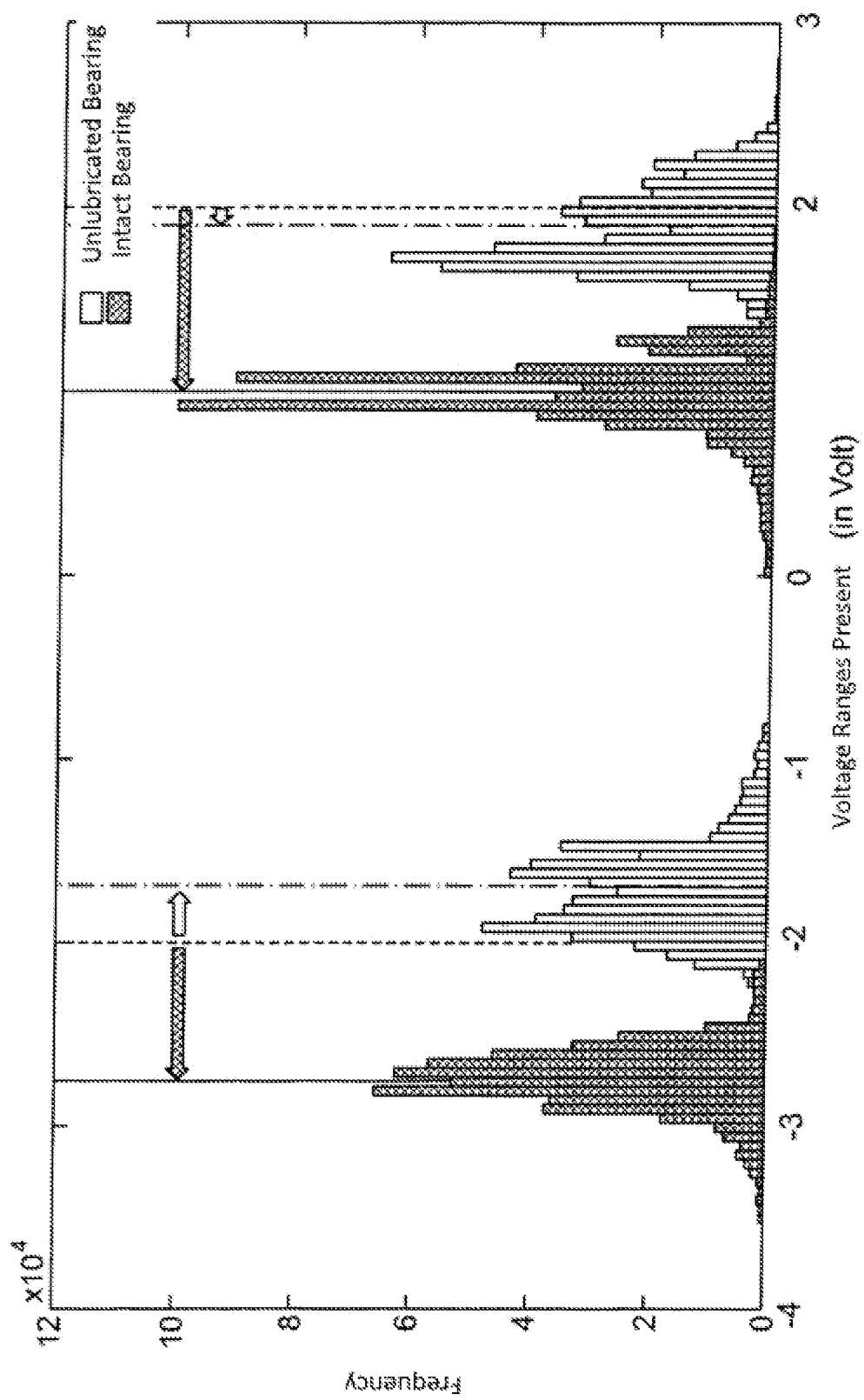

There are shown:

FIG. 1 a schematic cross section through a portion of a ball bearing,

FIG. 2a a schematic view of an experimental layout with a mechanical component in the form of a ball bearing and a measuring device, FIG. 2b a schematic view of a portion of the experimental layout shown in FIG. 2a, namely, the observed bearing, with further details, FIG. 3 a graph showing a reference voltage on an intact and on a nonlubricated bearing in the stationary state, FIG. 4 a graph showing the voltage curves on the intact and on the nonlubricated bearing in the operating state with 10% of the rated frequency for a segment of two milliseconds in the braking phase, FIG. 5 a histogram for comparing the reference voltage for the intact and the nonlubricated bearing in the stationary state, and FIG. 6 a histogram for comparing the frequency of voltage ranges for the intact and the nonlubricated bearing in the braking phase with 10% of the rated frequency.

FIG. 1 shows a schematic cross section through a portion of a ball bearing. One can recognize the outer race 1, the inner race 2, as well as a ball 3 of the ball bearing. Moreover, one can recognize the seals 4 mounted on the sides. Likewise shown is the lubricant 14 present between the outer race 1 and the ball 3 as well as the lubricant 14 present between the inner race 2 and the ball 3. Furthermore, unwanted interference currents 15 are shown, flowing from the inner race 2 across the lubricant to the ball 3 and from the ball 3 across the lubricant 14 to the outer race 1. Such unwanted currents 15 are often called bearing currents. FIG. 1 also illustrates the electrical equivalent of the components of the ball bearing highlighted in the dotted circle.

FIG. 2 shows an experimental layout which was used to demonstrate the efficacy of the invention. FIG. 2a shows schematically the layout of a bearing test stand as an embodiment. The mechanical component 5 involves ball bearings, which mount a rotor 7 driven by a motor shaft 6 in a stator 12. The motor shaft 6 is connected to a motor 8, which is supplied by means of a current source 9 and an inverter 10 connected in series with the current source 9. A voltage signal is coupled into the motor shaft 6 by means of a signal generator 17. The measuring device 11 used is a voltmeter, which is coupled to the stator 12 and determines the voltage difference between the stator 12 and ground (mass), for example. The voltage so determined is acquired in the time domain in an evaluation unit 13. The evaluation unit 13 calculates a histogram (see FIG. 5, FIG. 6) from the time-dependent voltage curves. The determination of the bearing state is done from the distribution of the histogram. From FIG. 2b one notices that two ball bearings are used as mechanical components 5 to mount the rotor. The state of the ball bearings can be determined by determining, as the electrical variable, the voltage difference present between the motor shaft (the stator 12) and ground (mass). As in FIG. 2a, the voltage so determined is acquired in the time domain by an evaluation unit 13. The evaluation unit 13 calculates a histogram (see FIG. 5, FIG. 6) from the time-dependent voltage curves. The determination of the bearing state is done from the distribution of the histogram.

For the early detection of bearing damage, two bearings of the same type were used as a specimen (one intact bearing and one defective, i.e., nonlubricated bearing). A square-wave signal with a fundamental frequency of 3 kHz and an amplitude of 2 V (2 V, −2 V) was used as the reference signal.

Two operating states were considered, namely, the stationary state of the ball bearings as a reference and a short time segment in the braking phase (reduction of rpms) at 10% of the maximum rpm of the motor/bearing.

In FIGS. 3 and 4, the Y-axis represents the voltage, the X-axis the time. In FIGS. 5 and 6, the Y-axis represents the frequency of the voltage range and the X-axis represents the voltage ranges present.

FIG. 3 shows the voltage curves of the reference voltage on the two bearings as a function of time in the stationary state. The phase shift here has no relevance, since the trials were conducted one after the other. It is to be noticed, however, that no amplitude difference can be found between the two bearings in the stationary state. And this was also to be expected in the stationary state, since no significant lubrication film is established in the bearing in the stationary state. The dc voltage difference between the reference voltages was 8.9 mV in the stationary state.

FIG. 4 shows the voltage curves of the two bearings as a function of time during the braking phase with 10% of the maximum rpm. The voltage curves of the two curves show transient processes caused by the rotary movement of the bearing. While the voltage curve remains almost symmetrical for the nonlubricated bearing, the voltage amplitude of the intact bearing is shifted downward by more than 800 mV. The dc voltage difference between the bearings was 932 mV in this segment of the braking phase.

FIG. 5 shows the frequency of the voltage range on the two bearings in the stationary state. It can be seen that all voltage ranges present are concentrated at the maximum amplitudes of the reference voltage and no significant voltage variances are present in other ranges.

FIG. 6 shows the histogram of the frequencies of the voltage ranges on the two bearings in the operating state with 10% of the maximum rpm (a short segment in the braking phase). For the nonlubricated bearing, a voltage shift can be seen, as also in FIG. 5. Moreover, a clear distinction can be seen between the two curves (between the intact bearing and between the nonlubricated bearing). The nature of the distribution of the voltage frequencies enables a coordination of the bearing state.

The vertical broken lines drawn in FIG. 6 represent the amplitude of the reference voltages. The vertical solid and dot and dashed lines represent the center of the voltage distributions for the two bearings. The black and white arrows show the shift intensity and the shift direction of the amplitude of the reference voltage. The investigations thus show that by investigating an electrical variable (here, the voltage) it is possible to ascertain the state of a mechanical component.

The invention claimed is:

1. Device for determining the state of a mechanical component, in which, when the component is in use, at least part of the component moves in relation to another component, including one or more of drives or bearings or transmissions, wherein:

a measuring device is configured to measure the voltage present across the movable mechanical component during a first measurement period and a second measurement period, the first and second measurement periods being of equal length, and an evaluation unit is configured to:

evaluate, with a multivariate statistical method, a first curve of the measured voltage during the first measurement period and a second curve of the measured voltage during the second measurement period;

compare a result of the evaluation of the first curve and a result of the evaluation of the second curve; and provide status information as to the state of the movable mechanical component on the basis of the comparison.

2. Device according to claim 1, wherein a table stored in the evaluation unit, in which respective status information about the state of the movable mechanical component is coordinated with a respective measurement result of the measuring device.

3. Device according to claim 1 further comprising a voltage source with which a voltage can be imposed across the movable mechanical component.

4. System comprising:

a mechanical component, wherein when the component is in use, at least part of the component moves in relation to another component, including one or more of drives or bearings or transmissions; and a device for determining the state of the mechanical component, wherein:

a measuring device is configured to measure the voltage present across the movable mechanical component during a first measurement period and a second measurement period, the first and second measurement periods being of equal length, and an evaluation unit is configured to:

evaluate, with a multivariate statistical method, a first curve of the measured voltage during the first measurement period and a second curve of the measured voltage during the second measurement period;

compare a result of the evaluation of the first curve and a result of the evaluation of the second curve; and provide status information as to the state of the movable mechanical component on the basis of the comparison.

5. System according to claim 4, further comprising an electric motor or voltage signal generator, which generates a bearing current or a voltage signal, which flows at least through portions of the movable mechanical component or is coupled into at least portions of the movable mechanical component.

6. Method for determination of the state of a mechanical component, comprising:

measuring, by a measuring device, a voltage present across a movable mechanical component during a first measurement period and a second measurement period, the first and second measurement periods being of equal length;

evaluating, with a multivariate statistical method by an evaluation unit, a first curve of the measured voltage during the first measurement period and a second curve of the measured voltage during the second measurement period;

comparing, by the evaluation unit, a result of the evaluation of the first curve and a result of the evaluation of the second curve; and providing, by the evaluation unit, status information as to the state of the movable mechanical component on the basis of the comparison.

7. Method according to claim 6, further comprising applying, by a voltage source, a voltage across the mechanical component.

8. Method according to claim 6, wherein the evaluation with a multivariate statistical method involves the determination of the frequency distribution of individual voltages over the first and second measurement periods.

* * * * *